United States Patent
Tseng et al.

(10) Patent No.: US 9,070,616 B2
(45) Date of Patent: Jun. 30, 2015

(54) METHOD OF FABRICATING PACKAGING SUBSTRATE

(71) Applicant: Unimicron Technology Corporation, Taoyuan (TW)

(72) Inventors: Tzyy-Jang Tseng, Taoyuan (TW); Chung-W. Ho, Taoyuan (TW)

(73) Assignee: Unimicron Technology Corporation, Taoyuan (TW)

( * ) Notice: Subject to any disclaimer, the term of this patent is extended or adjusted under 35 U.S.C. 154(b) by 27 days.

(21) Appl. No.: 14/097,656

(22) Filed: Dec. 5, 2013

(65) Prior Publication Data

US 2014/0090794 A1 Apr. 3, 2014

Related U.S. Application Data

(62) Division of application No. 13/542,928, filed on Jul. 6, 2012, now Pat. No. 8,624,382.

(30) Foreign Application Priority Data

Jul. 8, 2011 (TW) .............................. 100124360 A (51) Int. Cl.
*H01L 21/44* (2006.01)
*H01L 21/48* (2006.01)
(Continued)

(52) U.S. Cl.
CPC ........... *H01L 24/19* (2013.01); *H01L 23/49816* (2013.01); *H01L 23/49822* (2013.01); *H01L 23/49827* (2013.01); *H01L 21/4857* (2013.01); *H01L 2224/32225* (2013.01); *H01L 2224/73204* (2013.01); *H01L 24/16* (2013.01); *H01L 2224/13111* (2013.01);
(Continued)

(58) Field of Classification Search
CPC ..................... H01L 23/49822; H01L 21/4846; H01L 23/49827
USPC ........... 438/125, 612–614, 622; 257/E23.142
See application file for complete search history.

(56) References Cited

U.S. PATENT DOCUMENTS 5,886,877 A * 3/1999 Shingai et al. ................ 361/768
6,187,652 B1   2/2001 Chou et al.
(Continued)

FOREIGN PATENT DOCUMENTS

| EP | 2 068 361 | 6/2009 |
| TW | 201002166 | 1/2010 |
| TW | 201041469 | 11/2010 |

*Primary Examiner* — Nitin Parekh
(74) *Attorney, Agent, or Firm* — Mintz Levin Cohn Ferris Glovsky and Popeo, P.C.; Peter F. Corless; Steven M. Jensen (57) ABSTRACT

A packaging substrate includes a first dielectric layer; a plurality of first conductive pads embedded in and exposed from a first surface of the first dielectric layer; a first circuit layer embedded in and exposed from a second surface of the first dielectric layer; a plurality of first metal bumps disposed in the first dielectric layer, each of the first metal bumps having a first end embedded in the first circuit layer and a second end opposing the first end and disposed on one of the first conductive pads, a conductive seedlayer being disposed between the first circuit layer and the first dielectric layer and between the first circuit layer and the first metal bump; a built-up structure disposed on the first circuit layer and the first dielectric layer; and a plurality of second conductive pads disposed on the built-up structure. The packaging substrate has an over-warpage problem improved.

9 Claims, 8 Drawing Sheets

(51) Int. Cl.
*H01L 23/00* (2006.01)
*H01L 23/498* (2006.01)

(52) U.S. Cl.
CPC ............ *H01L 2224/13139* (2013.01); *H01L 2224/13144* (2013.01); *H01L 2224/13147* (2013.01); *H01L 2224/13155* (2013.01); *H01L 2224/16227* (2013.01); *H01L 2224/16225* (2013.01); *H01L 2924/15311* (2013.01)

(56) References Cited

U.S. PATENT DOCUMENTS

| | | | |
|---|---|---|---|
| 6,239,983 B1 | 5/2001 | Shingai et al. | |
| 6,324,067 B1 | 11/2001 | Nishiyama | |
| 6,919,226 B2 * | 7/2005 | Ogawa et al. | 438/108 |
| 7,521,799 B2 | 4/2009 | Hayashi et al. | |
| 7,791,186 B2 | 9/2010 | Kikuchi et al. | |
| 7,964,965 B2 | 6/2011 | Lee | |
| 8,039,756 B2 | 10/2011 | Kikuchi et al. | |
| 8,198,140 B2 * | 6/2012 | Murai et al. | 438/125 |
| 8,508,037 B2 | 8/2013 | Manusharow et al. | |
| 2003/0143833 A1 * | 7/2003 | Iijima et al. | 438/622 |
| 2003/0160325 A1 * | 8/2003 | Yoneda et al. | 257/758 |
| 2003/0162386 A1 | 8/2003 | Ogawa et al. | |
| 2004/0197962 A1 * | 10/2004 | Iijima et al. | 438/125 |
| 2005/0185382 A1 * | 8/2005 | Ooi et al. | 361/718 |
| 2007/0085194 A1 | 4/2007 | Mao et al. | |
| 2008/0191326 A1 | 8/2008 | Lin et al. | |
| 2009/0302457 A1 * | 12/2009 | Chida et al. | 257/702 |
| 2011/0024176 A1 * | 2/2011 | Ko | 174/261 |
| 2012/0155048 A1 * | 6/2012 | Kaneko | 361/783 |
| 2012/0161311 A1 * | 6/2012 | Miyasaka et al. | 257/734 |
| 2013/0026653 A1 | 1/2013 | Yamamichi et al. | |

* cited by examiner

METHOD OF FABRICATING PACKAGING SUBSTRATE

CROSS-REFERENCE TO RELATED APPLICATIONS

This application is a divisional of copending application U.S. Ser. No. 13/542,928, filed on Jul. 6, 2012, which claims under 35 U.S.C. §119(a) the benefit of Taiwanese Application No. 100124360, filed Jul. 8, 2011, the entire contents of which are incorporated herein by reference.

BACKGROUND OF THE INVENTION

1. Field of the Invention

This invention relates to packaging substrates and methods of fabricating the same, and, more particularly, to a coreless packaging substrate and a method of fabricating the same.

2. Description of Related Art

With the rapid development of electronic industry, electronic products gradually move toward a trend of multi-functional and high performance. Currently, structure of semiconductor package has been developed into various types. For example, wire-bonding type or flip-chip type, is to set semiconductor chip on a packaging substrate. Besides, the semiconductor chip is connected to packaging substrate by bonding wires or solder bumps.

In order to meet the demand of high integration and miniaturization for connection and carrying of more active, passive components and wires, packaging substrate gradually evolves from double-layer board to multi-layer board. So that circuit area of packaging substrate can be broaden within limited space by interlayer connection, and can satisfy the operation requirement of integrated circuit with high circuit density. Moreover, thickness of packaging substrate can be lowered and the purpose of low-profiled and compact-sized structure and improved electric function can be achieved.

In prior art, packaging substrate is composed of core board with internal circuit and symmetric, built-up circuit structure. Owing to the thickness increment of overall structure using core board, it is difficult to satisfy the needs of improving function while shrinking substrate volume.

Figure 1:
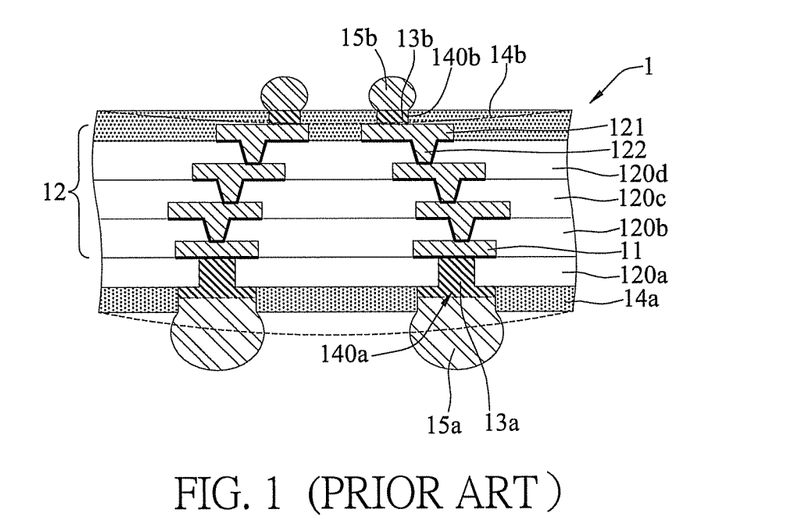
FIG. 1 (PRIOR ART) is a cross-sectional side view of a coreless packaging substrate of the prior art.

Thus, a coreless packaging substrate has been developed. Catch the trend of high-frequency and miniaturization by shortening circuit length and thickness of overall structure. As shown in FIG. 1, a coreless packaging substrate 1 is fabricated by the following steps of: forming a first dielectric layer 120a on a carrier board (not shown) and forming a first circuit layer 11 on the first dielectric layer 120a; forming a built-up structure 12 on the first dielectric layer 120a and the first circuit layer 11, the built-up structure 12 having second, third and fourth dielectric layers 120b, 120c and 120d, on which second circuit layers 121 that are electrically connected to one another by conductive vias 122 are formed; removing the carrier board to expose the first dielectric layer 120a; forming a solder mask 14a on the first dielectric layer 120a, and forming another solder mask 14b on the fourth dielectric layer 120d and the second circuit layer 121; forming openings 140a on the solder mask 14a and the first dielectric layer 120a to expose a portion of the first circuit layer 11, and forming another openings 140b on the solder mask 14b to expose a portion of the second circuit layer 121; and forming metal bumps 13a and 13b in the openings 140a and 140b, respectively, for bottom solder balls 15a and top solder balls 15b to be combined with, respectively, wherein a chip (not shown) may be disposed on the top solder balls 15b, and a circuit board (not shown) may be disposed on the bottom solder balls 15a. In the prior art, the packaging substrate 1 is fabricated in a bottom-up manner. In other words, the bottom side (i.e., a surface that is in contact with the carrier board) of packaging substrate 1 is fabricated first, then the intermediate components, such as the first to fourth dielectric layers 120a to 120d, are fabricated sequentially, and the metal bump 13b and the solder mask 14b are fabricated in the final step. In short, the packaging substrate 1 is fabricated from one side where the bottom solder balls 15a are implanted to the other side where the chip may be disposed.

Wherein, one curing process needs to be performed whenever one of the dielectric layers 120a to 120d is formed, in order to cure the newly formed and half cured dielectric layers 120a to 120d. Besides, the greater the number of the curing process performed is, the more complete the gathering and shrinking of molecules in one of the dielectric layers 120a to 120d become. The curing processes affect all the dielectric layers. In the packaging substrate 1, the curing process is performed four, three, two and one time on the first to fourth dielectric layers 120a to 120d, respectively.

As above-mentioned, because of the different number of the curing process performed on the first to fourth dielectric layers 120a to 120d, the first to fourth dielectric layers 120a to 120d have different residual stress to gather and shrink. Since the curing process is performed on the first dielectric layer 120a four times and is performed on the fourth dielectric layer 120d one time only, the first dielectric layer 120a has less residual stress than the fourth dielectric layer 120d. Because each dielectric layer exerts centralizing, residual stress on the packaging substrate 1, in the prior art the packaging substrate 1 presents a phenomenon of warpage that the fourth dielectric layer side 120d is sunken and the first dielectric layer side 120a is bulged. To be more detailed, the packaging substrate 1 in which the chip-disposing side is an upper side is in the shape of "smile," which is a characteristic of this kind of process, and the warpage phenomenon causes trouble to packaging substrate manufacture and to following packaging process, and then affects yield.

Notice that solder masks 14a and 14b are disposed on the first dielectric layer 120a and fourth dielectric layer 120d, respectively, and because the opening 140a of the solder masks on the lower side 14a is greater than the opening 140b of the solder mask on the upper side 14b, the actual covered area by the solder mask on the lower side 14a is smaller than that by the solder mask on the upper side 14b. That is, the upper solder mask 14b has more material than the lower solder mask 14a. The solder masks 14a and 14b also have residual stress to gather and shrink, so that the pull force from the upper solder mask 14b exerted on the packaging substrate is greater than that from the lower solder mask 14a, which causes warpage of packaging substrate 1 more serious (as indicated by a dotted line in FIG. 1).

In addition, the solder mask in the prior art and the external circuit layer it covers are non-coplanar, which also affects the yield and density of the package.

Therefore, how to overcome the over-warpage problem of the prior art is becoming the topic in urgent need to be solved.

SUMMARY OF THE INVENTION

In view of above-mentioned over-warpage problem of the prior art, the present invention provides a packaging substrate, including: a first dielectric layer having a first surface and an opposite second surface; a plurality of first conductive pads embedded in and exposed from the first surface of the first dielectric layer for a semiconductor chip to be disposed on the first conductive pads; a first circuit layer embedded in and exposed from the second surface of the first dielectric layer; a plurality of first metal bumps disposed in the first dielectric layer, each of the first metal bumps having a first end and an opposite end, wherein the first end is embedded in the first circuit layer, the second end is disposed on one of the first conductive pads, and a conductive seedlayer is disposed between the first circuit layer and the first dielectric layer and between the first circuit layer and the first metal bump; a built-up structure disposed on the first circuit layer and the first dielectric layer; and a plurality of second conductive pads disposed on the built-up structure for an external electronic device to be disposed on the second conductive pads.

The present invention further discloses a method of fabricating a packaging substrate, including: providing a carrier board having two opposite surfaces, on which a plurality of first conductive pads formed for semiconductor chips to be disposed on the first conductive pads; forming first metal bumps on the first conductive pads, each of the first metal bumps having a first end and an opposite second end, wherein the second end is disposed on one of the first conductive pads; covering the surfaces of the carrier board, the first conductive pads and the first metal bumps with a first dielectric layer that has a plurality of first intaglios for exposing top and side surfaces of the first ends of the first metal bumps, respectively; forming a conductive seedlayer on the first dielectric layer and the first ends of the first metal bumps; forming a metal layer on the conductive seedlayer; removing a portion of the metal layer and the conductive seedlayer that is over a top surface of the first dielectric layer, and forming a first circuit layer in the first intaglios; forming a built-up structure on the first circuit layer and the first dielectric layer, an outermost layer of the built-up structure having second conductive pads for an external electronic device to be disposed on the second conductive pads; and removing the carrier board.

From the foregoing contents, the packaging substrate of the disclosed embodiments are fabricated from chip-disposing side to side that connects an external electronic device. This made the overall packaging substrate with final chip-disposing side up in the shape of "anti-smile." But removed area of first dielectric layer (top dielectric layer) is smaller than that of bottom dielectric layer, generating a stress that makes packaging substrate in the shape of "smile." Finally, the stress of "smile" and "anti-smile" offset each other, causing overall packaging substrate to be more flat.

In addition, packaging substrate made by the disclosed embodiments with conductive pads and dielectric layer flush on the surface is beneficial to package process of high density for the increment of density of conductive pads.

Besides, the disclosed embodiments replace solder mask of green painting in prior art with dielectric layer, so that material of each layer of packaging substrate is uniform and pure, which is beneficial to the stability and smoothness of overall packaging substrate. The yield is also promoted.

Furthermore, method of laser ablation is not necessary for process of metal bumps in the disclosed embodiments. Although laser is capable of raising overall speed through adjustment, laser forms one via at a time. Thus, the disclosed embodiments can reduce process time effectively by forming a plurality of metal bumps simultaneously. The cost is also lowered. And reliability of combination in disclosed embodiments is raised by embedding metal bumps into circuit layer.

BRIEF DESCRIPTION OF THE DRAWINGS

For a fuller understanding of the nature and desired objects of the subject invention, reference is made to the following detailed description taken in conjunction with the accompanying drawing figures wherein like reference character denote corresponding parts throughout the several views and wherein:

FIGS. 3A'-3D' are cross-sectional side views of a packaging substrate and a method of fabricating the packaging substrate according to a third embodiment of the present invention.

DETAILED DESCRIPTION OF PREFERRED EMBODIMENTS

The following is explanation of the disclosed embodiments by examples, and those who are familiar with this technical field can easily understand the advantages and efficacy by the explanation.

Notice that the illustrated structure, ratio and size of appended figures in the explanation are only used for the disclosed embodiments in the explanation for understanding and reading of those who are familiar with this technical field. It is not applicable for limiting implementing condition of the disclosed embodiments, so the illustration doesn't have actual meaning in the technical field. Any modification of structure, change of ratio and adjustment of size should fall in the disclosed embodiments when the efficacy and purpose of the disclosed embodiments are not affected. Meanwhile, the terms that are quoted in the explanation like "upper," "a" and so on only intent for convenience of description rather than limiting feasible scope of the disclosed embodiments. Change or adjustment of relative relationship under no actual alteration of content of technique should be seen as feasible scope of the disclosed embodiments.

Figure 2A:
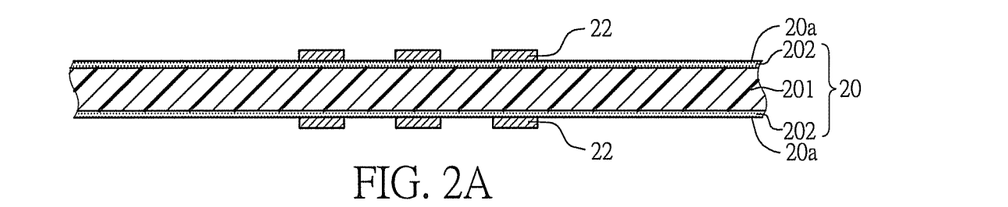
FIGS. 2A-2O are cross-sectional side views of a packaging substrate and a method of fabricating the packaging substrate according to a first embodiment of the present invention.
Figure 2B:
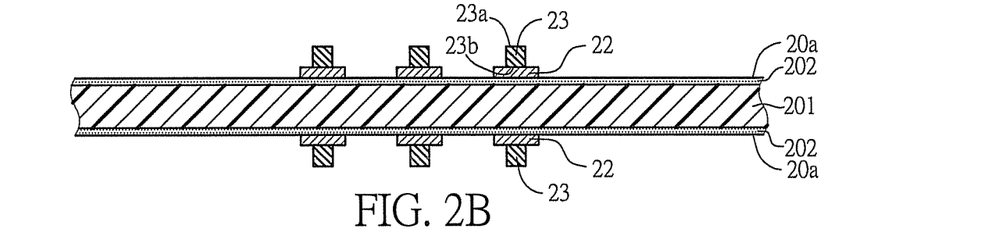
Figure 2C:
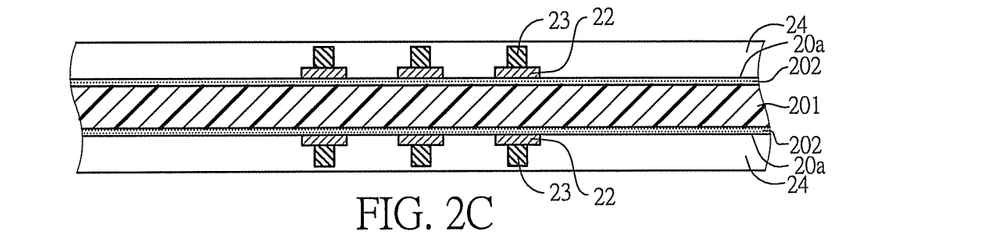
Figure 2D:
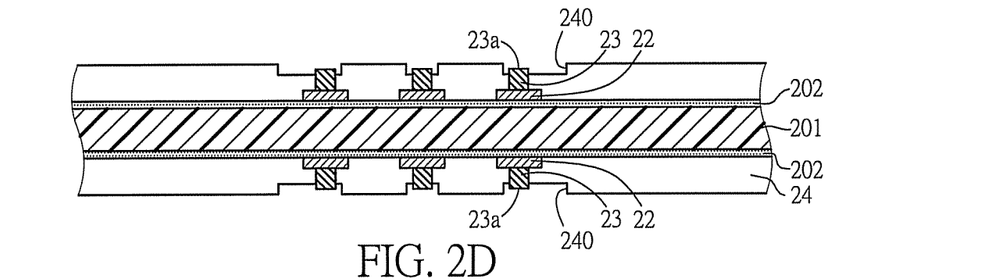
Figure 2E:
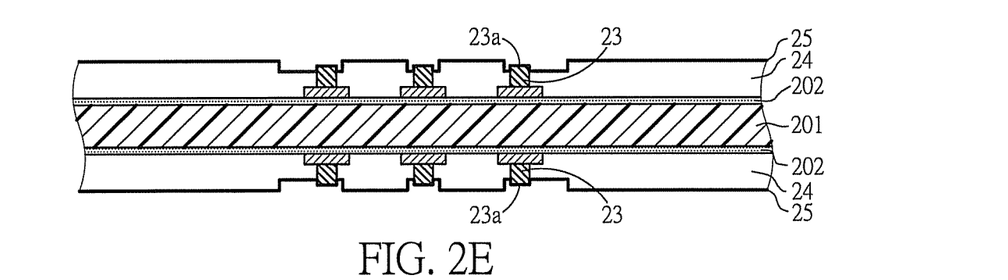
Figure 2F:
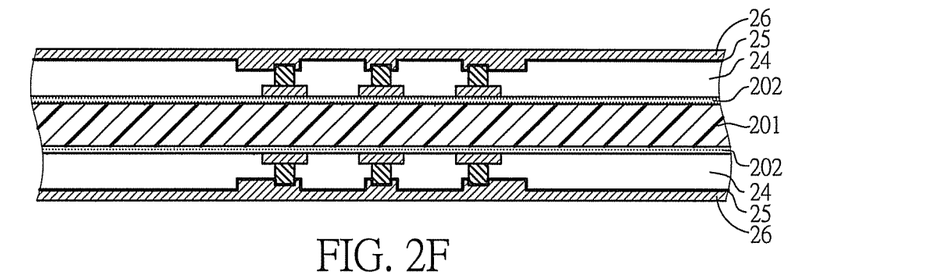
Figure 2G:
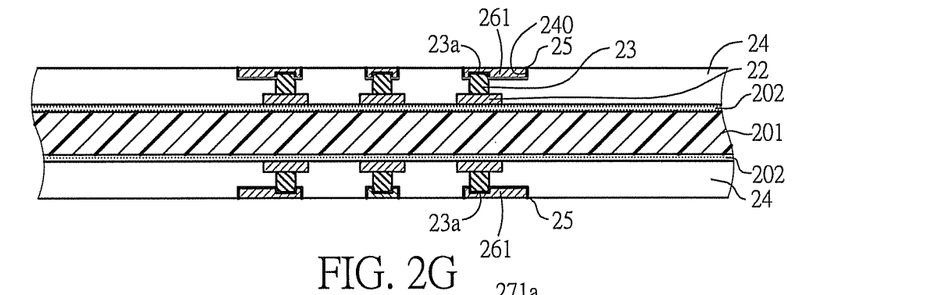
Figure 2H:
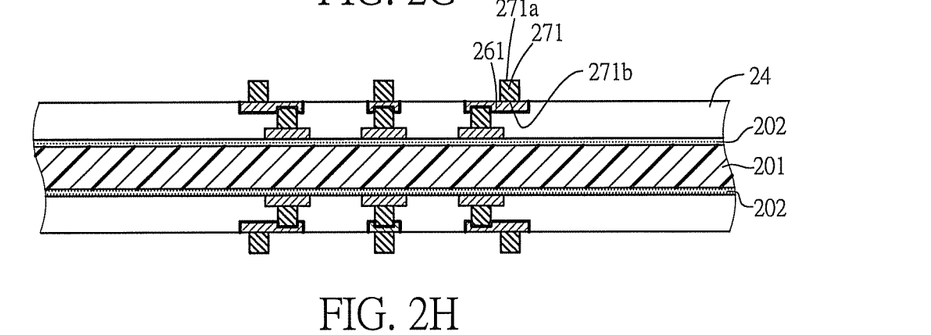
Figure 2I:
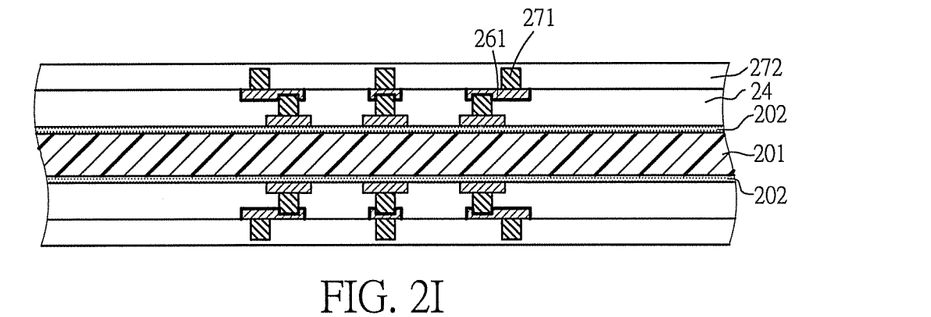
Figure 2J:
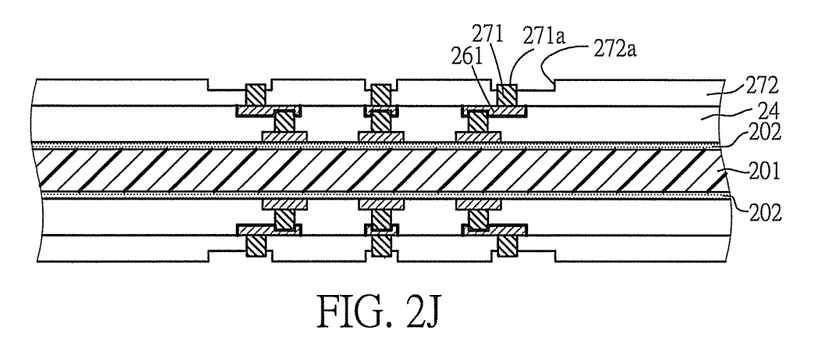
Figure 2K:
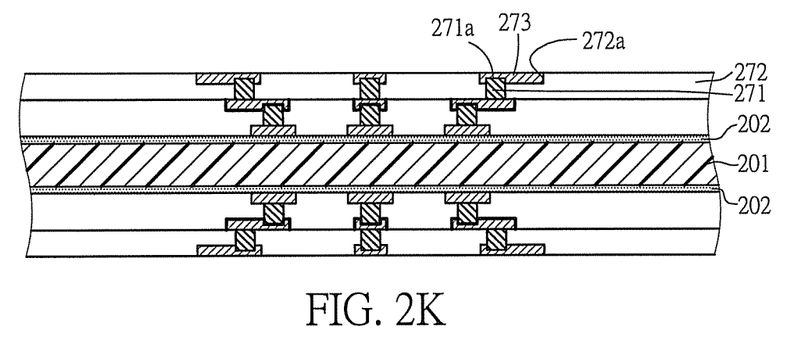
Figure 2L:
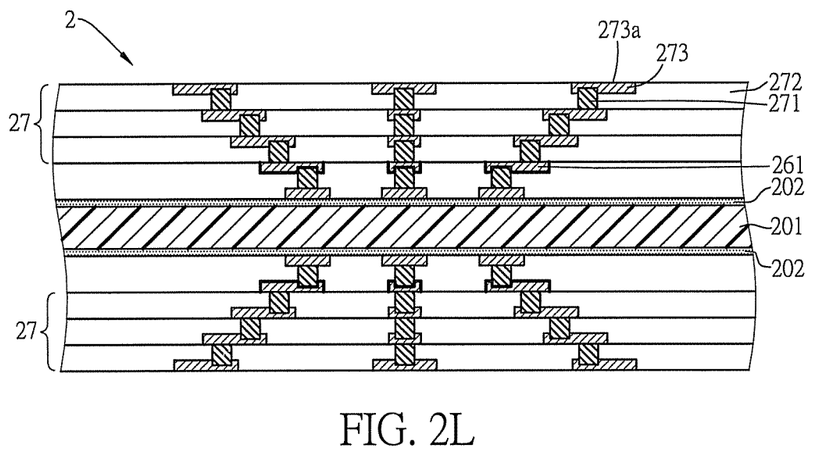
Figure 2M:
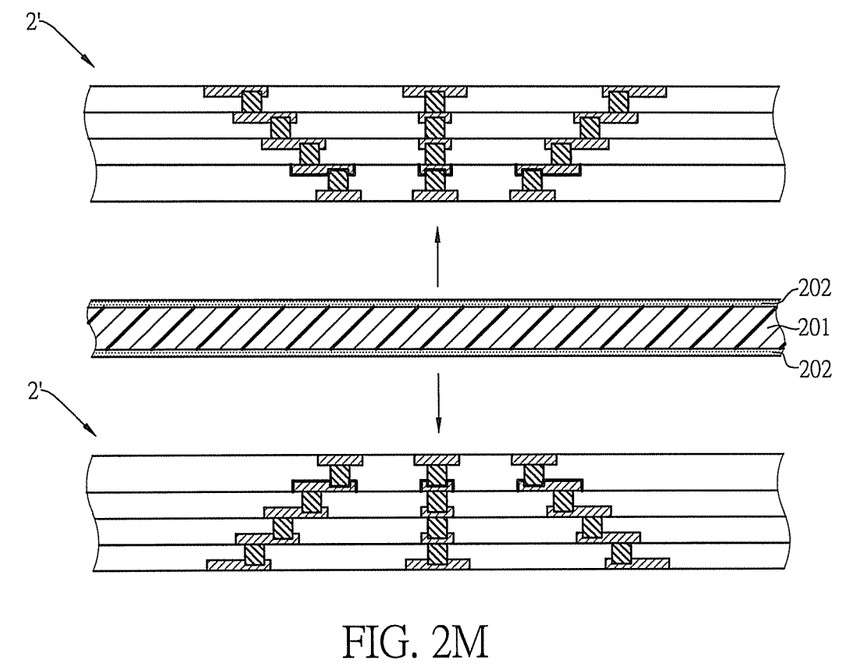
Figure 2N:
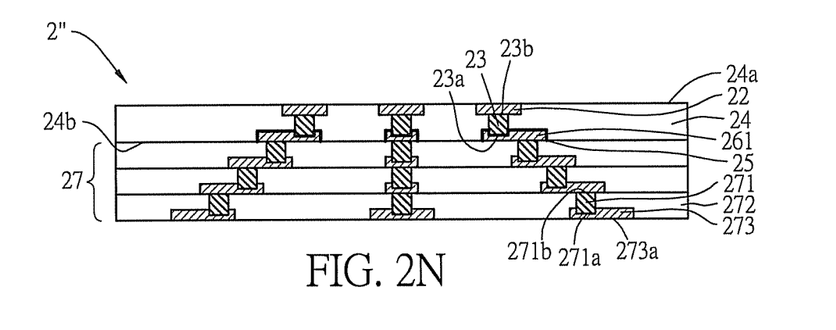
Figure 2O:
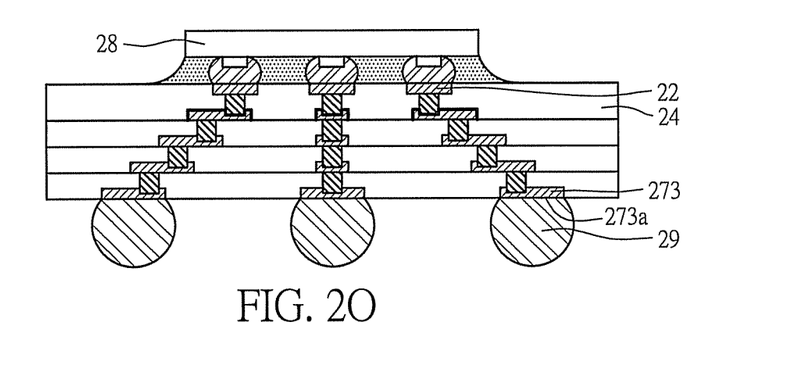

Please refer to FIGS. 2A to 2O, which illustrate a method of fabricating a packaging substrate of a first embodiment according to the present invention.

As shown in FIG. 2A, a carrier board 20 is provided with two opposing surfaces 20a, each of which is provided with a plurality of first conductive pads 22, for semiconductor chips 28 to be disposed thereon (referring to FIG. 2O). The carrier board 20 includes a supporting layer 201 and medium layers 202 formed on two opposing surfaces of the supporting layer 201. The first conductive pads 22 are disposed on the medium layers 202.

As shown in FIG. 2B, first metal bumps 23 are disposed on the first conductive pads 22. Each of the first metal bumps has a first end 23a and a second end 23b opposing the first end 23a, and the second end 23b is connected to one of the first conductive pads 22.

In an embodiment of the present invention, the first metal bumps 23 are made of copper, nickel, tin, gold, silver or copper-tin alloy, and are made in, but not limited to, an additive process, a semi-additive process, a subtractive process, an electroplating process, an electroless plating deposition process, a chemical deposition process or a printing process.

As shown in FIG. 2C, first dielectric layers 24 covers surfaces 20a of the carrier board 20, the first conductive pads 22, and the first metal bumps 23.

As shown in FIG. 2D, a plurality of first intaglios 240 are formed in the first dielectric layers 24 to expose top and side surfaces of the first ends 23a of the first metal bumps 23.

As shown in FIG. 2E, conductive seedlayers 25 are formed on the first dielectric layers 24 and the first ends 23a of the metal bumps 23.

As shown in FIG. 2F, metal layers 26 are formed on the conductive seedlayers 25.

As shown in FIG. 2G, a portion of the metal layers 26 and the conductive seedlayers 25 higher than a top surface of the first dielectric layers 24 are removed, thereby forming first circuit layers 261 in the first intaglios 240.

In addition to the electroplating technique, the first circuit layer 261 can also be formed by forming a mask layer (not shown) on the structure shown in FIG. 2C, and patterning the mask layers by laser to form the first intaglios 240 shown in FIG. 2D; then comprehensively forming an active layer (not shown). In an embodiment of the present invention, the active layer can be formed by a dipping technique. In detail, the active layer can be soaked in a chemical solution consisting essentially of a plurality of metal granules, where the granules can be adhered to the mask layers, a surface of the first intaglios 240, an exposed top surface and a side surface of the first ends 23a, thereby forming the active layer. The metal granules can be palladium, platinum, gold or silver, for example. The palladium granules could be made from colloid of tin-palladium chloride or chelator of palladium sulfate. The mask layers and the active layer formed thereon are then removed. Finally, a first circuit layer 261 is formed on the active layer in the first intaglios 240, as shown in FIG. 2G, by an electroless plating technique. All of the embedded circuit in the disclosed embodiments can apply the above-mentioned method to form, so the following would not explain anymore.

As shown in FIGS. 2H to 2L, the processes from FIGS. 2B to 2G are performed iteratively, so as to form second metal bumps 271 and second dielectric layers 272. The method of forming the second metal bumps 271 can refer to the method of forming the first metal bumps 23 mentioned above. A plurality of second intaglios 272a that expose top surfaces and side surfaces of third ends 271a of the second metal bumps 271 are formed in the second dielectric layers 272. Second circuit layers 273 are formed in second intaglios 272a. Second metal bumps 271, second dielectric layers 272 and second circuit layers 273 may be formed subsequently, if necessary, in order to form a built-up structure 27 on the first circuit layers 261 and the first dielectric layers 24. The built-up structure 27 includes at least a second dielectric layer 272, a second circuit layer 273 embedded in and exposed from a surface of second dielectric layer 272, and a plurality of second metal bumps 271 formed in the second dielectric layer 272 and electrically connected to the first circuit layer 261 and the second circuit layer 273 or electrically connected to the second circuit layers 273. Each of the second metal bumps 271 has a third end 271a and a fourth end 271b opposing the third end 271a, with the third end 271a of the second metal bumps 271 embedded in the second circuit layers 273, and the second conductive pads 273a disposed on the outermost one of the second circuit layers 273. In this way, overall laid-out packaging substrate 2 in upper-and-lower pairs is constructed. Besides, the outermost layers of the built-up structure 27 can also have a plurality of conductive pads 273a for an external electronic device to be connected thereto. This is the overall laid-out packaging substrate 2 in upper-and-lower pairs.

Notice that, though the conductive seedlayers of built-up structure 27 are not illustrated, it should be known that second circuit layer 273 of this example of embodiment can be formed by the electroplating and follow-up polishing procedure of the conductive seedlayers (Similar to the steps from FIGS. 2E to 2G).

As shown in FIG. 2M, the carrier board 20 is removed to separate the overall packaging substrate 2 in upper-and-lower pairs to become two overall substrates 2'.

As shown in FIG. 2N, a singulation process is performed, to obtain a plurality of packaging substrates 2".

As shown in FIG. 2O, a semiconductor chip 28 is disposed on the first conductive pads 22, and solder balls 29 are disposed on the second conductive pads 273a. In an embodiment of the present invention, the packaging substrates 2" are divided first and the semiconductor chip 28 is then disposed on the first conductive pads 22. The semiconductor chip 2'" may also be disposed on the first conductive pads 22 first and the singulation process is performed on the packaging substrate.

Please refer to FIGS. 3A to 3E, which are cross-sectional views of a packaging substrate and a method of fabricating the same of a second embodiment according to the present invention.

The second embodiment differs from the first embodiment in the process and structure of built-up structure.

Specifically, the built-up structure 31 in the second embodiment is fabricated by forming a second dielectric layers 311, and then vias 311a and second intaglios 311b are formed in the second dielectric layers 311. Conductive vias 312 and second circuit layers 313 are formed in the vias 311a and the second intaglios 311b, respectively. That is, the built-up structure 31 in the second embodiment includes at least a second dielectric layer 311, second circuit layers 313 embedded in and exposed from the second dielectric layer 311, and a plurality of vias 312 formed in the second dielectric layer 311 and electrically connected to the first circuit layer 261 and the second circuit layer 313 or electrically connected to the second circuit layers 313. Besides, the outermost one of the second circuit layers 313 has second conductive pads 313a.

Figure 3A:
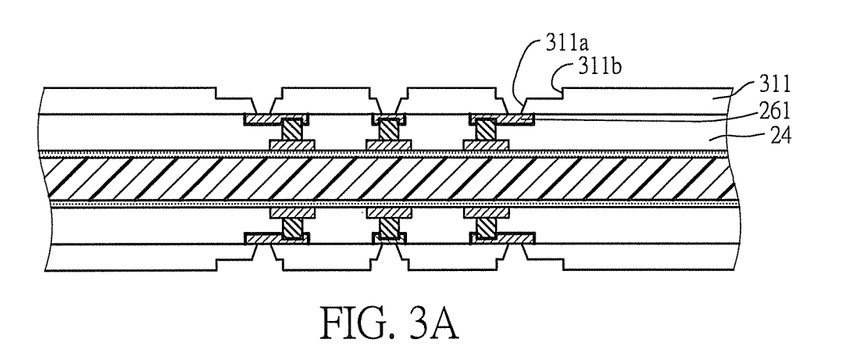
FIGS. 3A-3E are cross-sectional side views of a packaging substrate and a method of fabricating the packaging substrate according to a second embodiment of the present invention.
Figure 3B:
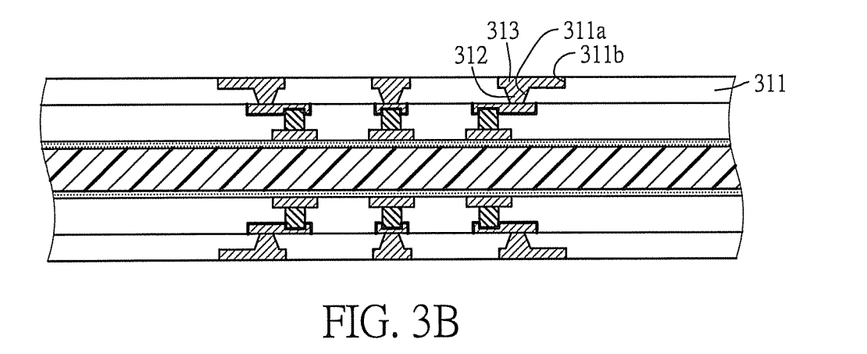
Figure 3C:
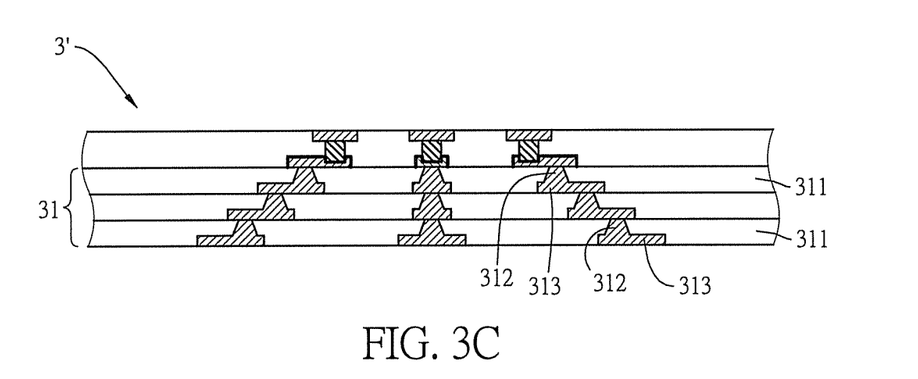
Figure 3D:
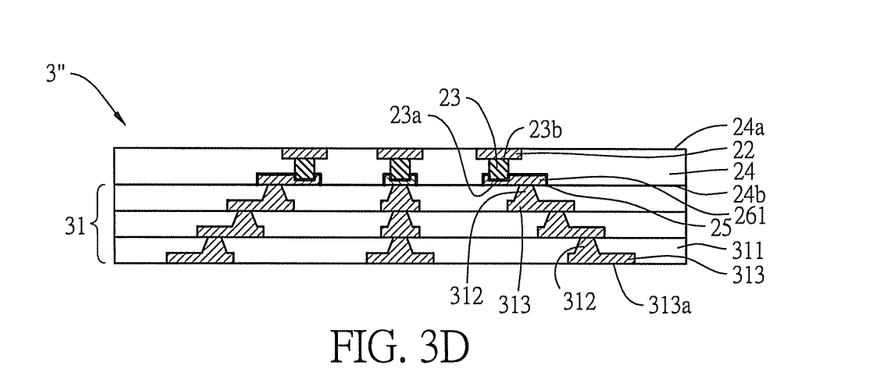
Figure 3E:
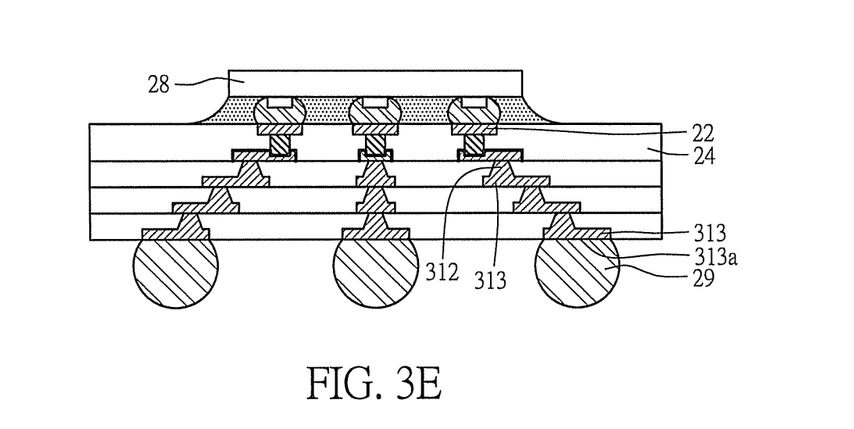

Please refer to FIGS. 3A' to 3D', which are cross-sectional views of a packaging substrate and a method of fabricating the same of a third embodiment according to the present invention. The third embodiment differs from the second embodiment in that a built-up structure 31' in the third embodiment is not embedded in a second dielectric layer.

In detail, the built-up structure 31' in the third embodiment is fabricated by forming a second dielectric layer 311', forming vias 311a' in the second dielectric layers 311', and forming conductive vias 312' and second circuit layer 313' on the vias 311a' and the second dielectric layer 311', respectively. That is, the built-up structure 31' includes at least a second dielectric layer 311', a second circuit layer 313' formed on the second dielectric layer 311', and a plurality of conductive vias 312' formed in the second dielectric layer 311' and electrically connected to the first circuit layer 261 and the second circuit layer 313' or electrically connected to the second circuit layers 313'. Besides, the outermost one of the second circuit layers 313' has second conductive pads 313a'.

The disclosed embodiments provide a packaging substrate, including: a first dielectric layer 24 with opposing first surface 24a and second surface 24b, a plurality of first conductive pads 22 embedded in and exposed from the first surface 24a of the first dielectric layer 24 for a semiconductor chip 28 to be connected to the first conductive pads 22, a first circuit layer 261 embedded in and exposed from the second surface 24b of the first dielectric layer 24, and a plurality of first metal bumps 23 disposed in the first dielectric layer 24, wherein each of the metal bumps has opposing first end 23a and second end 23b, the second end 23b connected to the first conductive pad 22, the first end 23a embedded in the first circuit layer 261. The packaging substrate further comprises a conductive seedlayer 25 disposed among the first circuit layer 261, the first dielectric layer 24 and the first metal bumps 23, built-up structures 27, 31 or 31' disposed on the first circuit layers 261 and the first dielectric layers 24, and a plurality of second conductive pads 273a, 313a or 313a' disposed on the outermost layers of the built-up structure 27, 31 or 31' for an external electronic device to be connected thereto.

In the above-mentioned packaging substrate, the built-up structure 27 includes at least a second dielectric layer 272, a second circuit layer 273 embedded in and exposed from the surface of second dielectric layer 272, and a plurality of second metal bumps 271 disposed in second dielectric layer 272 and electrically connected to first circuit layer 261 and the second circuit layer 273 or electrically connected to second circuit layers 273, each of the second metal bumps having a third end 271a embedded in the second circuit layer 273 and a fourth end 271b opposing the third end 271a. The outermost one of the second circuit layers has second conductive pads 273a.

As above-mentioned packaging substrate, the built-up structure 31 includes at least a second dielectric layer 311, a second circuit layer 313 embedded in and exposed from the surface of second dielectric layer 311, a plurality of vias 312 disposed in the second dielectric layer 313 and electrically connected to the first circuit layer 261 and the second circuit layer 313 or electrically connected to the second circuit layers 313. the outermost one of the second circuit layers 313 has second conductive pads 313a.

In the packaging substrate mentioned above, the built-up structure 31' includes at least a second dielectric layer 311', a second circuit layer 313' disposed on the second dielectric layer 311, a plurality of vias 312' disposed in the second dielectric layer 311' and electrically connected to the first circuit layer 261 and second circuit layer 313' or electrically connected to the second circuit layers 313'. The outermost one of the second circuit layers 313' has second conductive pads 313a'.

In an embodiment of the present invention, the external electronic device can be a circuit board or other package structures.

To sum up, a packaging substrate in the disclosed embodiments is fabricated from chip-disposing side to the side connected to an external electronic device, which causes the overall packaging substrate with final chip-disposing side upon in the shape of "anti-smile." Because the removed area of the first dielectric layer (top dielectric layer) is smaller than the bottom dielectric layer, stress generated that makes packaging substrate in the shape of "smile." Finally the stress of "smile" and "anti-smile" offset, causing overall packaging substrate more flat.

Besides, packaging substrate made in the disclosed embodiments with conductive pads and dielectric layer flush on the surface can raise the density of conductive pads, which is beneficial to package process of high density.

And the disclosed embodiments replace solder mask of green painting in prior art with dielectric layer, causing material of each layer uniform and pure, which is beneficial for stability and smoothness of overall packaging substrate. Yield is also raised.

Furthermore, it is not necessary for process of metal bumps in the disclosed embodiments to use traditional method of laser ablation, though laser can raise overall speed through adjustment, laser can only form a via at a time. Thus, the disclosed embodiments form a plurality of metal bumps simultaneously can effectively reduce time of process and cost down. By embedding metal bumps in circuit layers, contact area between the circuit layer and metal bumps increases, so the combination of both is better, and then overall reliability is raised.

Above-mentioned examples of embodiments illustratively explain theory and efficacy of the disclosed embodiments rather than limiting the disclosed embodiments. Anyone who is familiar with this technical field can make alterations if the spirit and scope of the disclosed embodiments are not violated. Thus the scope of rights protection should be accordance with the following list.

What is claimed is:

1. A method of fabricating a packaging substrate, comprising:
   providing a carrier board having two opposite surfaces, on which a plurality of first conductive pads disposed for semiconductor chips to be disposed on the first respective conductive pads;
   forming first metal bumps on the first conductive pads, each of the first metal bumps having a first end and an opposite second end, wherein the second end is disposed on one of the first conductive pads;
   covering the surfaces of the carrier board, the first conductive pads and the first metal bumps with a first dielectric layer that has a plurality of first intaglios for exposing top and side surfaces of the first ends of the first metal bumps, respectively;
   forming a conductive seedlayer on the first dielectric layer and the first ends of the first metal bumps;
   forming a metal layer on the conductive seedlayer;
   removing a portion of the metal layer and the conductive seedlayer that is over a top surface of the first dielectric layer, and forming a first circuit layer in the first intaglios;
   forming a built-up structure on the first circuit layer and the first dielectric layer, an outermost layer of the built-up structure having second conductive pads for an external electronic device to be disposed on the second conductive pads; and
   removing the carrier board.

2. The method of claim 1, further comprising performing a singulation process to obtain a plurality of packaging substrates.

3. The method of claim 1, wherein the carrier board comprises a supporting layer and an intermediate layer formed on two opposite surfaces of the supporting layer, and the first conductive pads and the first dielectric layer are disposed on the intermediate layer.

4. The method of claim 1, wherein the built-up structure comprises at least a second dielectric layer, a second circuit layer embedded in and exposed from the second dielectric layer, and a plurality of second metal bumps disposed in the second dielectric layer and electrically connected to the first circuit layer and second circuit layer or electrically connected to the second circuit layers, each of the second metal bumps having a third end and an opposite fourth end, wherein the third end is embedded into the second circuit layer and the second conductive pads are disposed on an outermost one of the second circuit layers.

5. The method of claim 4, wherein each of the built-up structure is fabricated by:
   forming the second metal bumps;
   forming the second dielectric layer on the second metal bumps;

forming in the second intermediate layer a plurality of second intaglios, from which top and side surfaces of the second metal bumps are exposed; and forming the second circuit layer in the second intaglios.

6. The method of claim 1, wherein the built-up structure comprises at least a second dielectric layer, a second circuit layer embedded in and exposed from the second dielectric layer, and a plurality of conductive vias disposed in the second dielectric layer and electrically connected to the first circuit layer and second circuit layer or electrically connected to the second circuit layers, wherein the second conductive pads are disposed on an outermost one of the second circuit layers.

7. The method of claim 6, wherein the built-up structure is fabricated by:
    forming the second dielectric layer; and
    forming vias and second intaglios in the second dielectric layer, and forming the conductive vias and the second circuit layer in the vias and second intaglios, respectively.

8. The method of claim 1, wherein the built-up structure comprises at least a second dielectric layer, a second circuit layer formed on the second dielectric layer, and a plurality of conductive vias formed in the second dielectric layer and electrically connected to the first circuit layer and second circuit layer or electrically connected to the second circuit layers, wherein the second conductive pads are disposed on an outermost one of the second circuit layers.

9. The method of claim 8, wherein the built-up structure is fabricated by:
    forming the second dielectric layer;
    forming vias in the second dielectric layer; and
    forming the conductive vias and the second circuit layer in the vias and the second dielectric layer, respectively.

* * * * *